United States Patent [19]

Womack

[11] Patent Number: 4,704,705
[45] Date of Patent: Nov. 3, 1987

[54] TWO TRANSISTOR DRAM CELL AND ARRAY

[75] Inventor: Richard H. Womack, Dallas, Tex.

[73] Assignee: Texas Instruments Incorporated, Dallas, Tex.

[21] Appl. No.: 757,099

[22] Filed: Jul. 19, 1985

[51] Int. Cl.[4] ............................................. G11C 11/24
[52] U.S. Cl. .................................... 365/149; 357/23.6
[58] Field of Search .............. 365/149, 189; 357/23.6, 357/51, 41, 55

[56] References Cited

U.S. PATENT DOCUMENTS

| 4,086,662 | 4/1978 | Itoh | 365/189 |
| 4,432,072 | 2/1984 | Chao et al. | 365/149 |
| 4,577,395 | 3/1986 | Shibata | 357/51 X |

OTHER PUBLICATIONS

W. Fischer, "One-Transistor-Cell Memory with Reduced Reference Cell Size", IBM Technical Disclosure Bulletin, vol. 20, No. 4, Sep. 1977, pp. 1501-1502.

*Primary Examiner*—Joseph A. Popek
*Attorney, Agent, or Firm*—Leo N. Heiting; N. Rhys Merrett; Melvin Sharp

[57] ABSTRACT

A two transistor Dynamic Random Access Memory Cell and Array. Use of two pass transistors in series for the cell provides numerous additional capabilities for the DRAM array, and, in the preferred embodiment, provides bitline segment multiplexing, so that the sense amplifier pitch can be increased while the bitline capacitance as seen by the sense amplifier and by the memory cell is reduced. To accomplish this, the parasitic capacitance of the node between the two series pass transistors is kept to a minimum.

17 Claims, 7 Drawing Figures

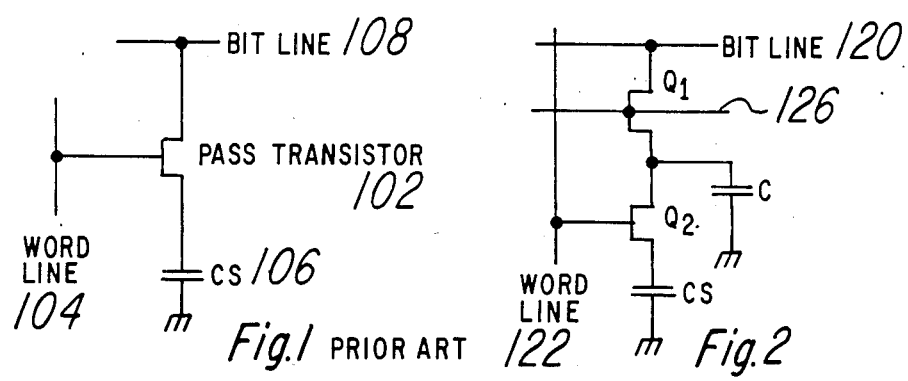
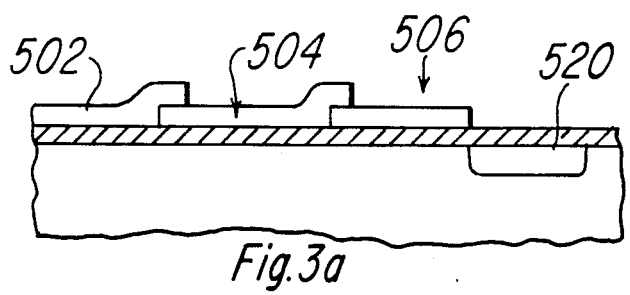
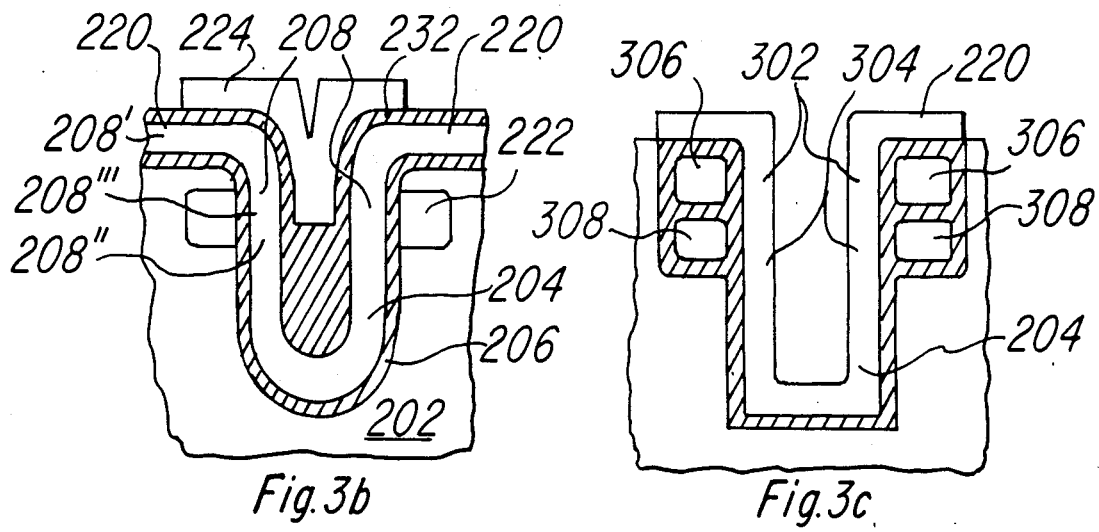

TWO TRANSISTOR DRAM CELL AND ARRAY

BACKGROUND AND SUMMARY OF THE INVENTION

The present invention relates semiconductor integrated circuit memories.

Development of dynamic random access memories (DRAMs) has concentrated on the one transistor cell ever since the breakthroughs incorporated in the generation of 16K DRAMs announced around 1970. With many incremental advances in technology, this technology has been scaled to the point where several one megabit DRAMs, all of them using single-transistor cells (and many of them using essentially the same single-transistor cell as was used in the 16K DRAMs) have recently been announced. As the memory technology has advanced, one of the necessary changes is that the cell size must be made smaller, so that an adequate number of memory cells can be fit into a feasible chip area.

However, this shrinkage in cell size, while intrinsically highly advantageous, has produced some significant problems with conventional technology. One of these problems is the sense amplifier pitch. That is, if one sense amplifier along the edge of an array of memory cells is connected to every two columns of memory cells, then the permissible spacing of the memory cells will be constrained by the possible width of the sense amplifiers, if the sense amplifiers cannot be made as narrow as twice the width of one column of minimum-geometry memory cells. Moreover, the ideal memory cell, would be, in effect, a crosspoint in a wiring matrix; by contrast, conventional memory cells are not located at every bitline and word line intersection in a memory array, but rather at every other bitline/word line intersection. However, if such an ideal cross-point DRAM cell becomes available, the problem of sense amplifier pitch will obviously immediately become much more acute. Recent inventions of common assignee have indicated the possibility of such a cross-point DRAM cell; see U.S. patent application Ser. Nos. 679,168 654,285, and 655,972, which are hereby incorporated by reference.

Another important problem of the prior art is bitline capacitance. This is becoming a more serious problem as technology seeks to advance beyond the one megabit level, for several reasons. First, simple scaling laws indicate that, if a 16K DRAM were simply scaled up, the number of memory cells per column would increase as the square root of the number of bits on the chip. However, a bitline connected to 512 memory cells would have a very large capacitance. Large bitline capacitances are undesirable for several reasons. One of them is that the bitline capacitance is typically substantially larger than the storage capacitance of the memory cell, so that the limited voltage swing available at the cell node is further reduced by at least the ratio of these capacitances. Thus, other factors being equal, larger bitline capacitance means that less noise immunity is available when the output of a memory cell is being sensed, and this advantage can alternatively be traded off for a number of other advantages. Moreover, reduced bitline capacitance also typically means higher speed in the column sensing operation, since lowering the capacitance of the bitline will also lower the RC time constant associated with it. A closely related problem is delays in the word line. In a large memory array, the word line (i.e. the line which addresses the single pass transistor of each cell in a row of cells in the prior art) will typically have an RC time constant which imposes a quite substantial fraction of the total delay required for accessing the cell. Thus, shortening the word line will lower its RC time constant by lowering both its resistance and capacitance, and therefore would be highly desirable.

These pressures have been dealt with in the prior art by increased segmentation of the memory cells into sub-arrays, but this approach also has its own difficulties. First, sub-array-select logic must be used at the chip level, which imposes additional delays and requires additional area. Second, if the number of sub-arrays is made very large, the wiring needed to interconnect the sub-arrays may itself begin to be a substantial demand on area and on processing.

Another factor which has put additional pressure on bitline capacitance and word line capacitance is a change in the nature of scaling at small geometries. That is, the capacitance per unit length of a metal line which is 10 microns wide will be approximately twice the capacitance per unit length of a metal line of equal thickness which is only five microns wide. However, at smaller geometries, the fringing fields of the corners of the patterned conductors become important, so that this scaling relation does not obtain any longer. That is, a metal line (or polysilicon, or silicide or polycide) which is 0.75 of a micron wide will have much more than half the capacitance of a similar line which is 1.5 microns wide, while its resistance will probably be doubled. This means that scaling laws which have operated favorably in scaling down to 1.5 microns cease to operate so favorably, and thus further scaling is made difficult.

To solve these two problems, the present invention provides a DRAM transistor cell which has two pass transistors connected in series. This additional transistor per cell provides the capability for multiplexing a sense amplifier among several columns, or of segmenting the word lines or the bitlines, without the additional levels which otherwise may be required for bitline segmentation.

In addition, the present invention teaches embodiments of a DRAM cell having two pass transistors which require no additional area over that required by a DRAM cell having one pass transistor. In particular, one particularly preferred embodiment of the present invention teaches a DRAM cell wherein the capacitor is formed in a trench, and the pass transistors are formed as thin polysilicon channel transistors within the trench. Thus, no additional horizontal area is taken up by the extra pass transistor.

A key point of the present invention is minimization of the parasitic capacitance of the node between the two pass transistors. This parasitic capacitance gives a mechanism for the storage charge to be pumped out of the memory cell. For example, if the transistor which is directly connected to the storage capacitor is turned on, charge sharing between the parasitic capacitance node and the storage capacitor will occur, and thereafter, when the other pass transistor turns on, charge can be shared between the parasitic capacitance and the bitline. Thus, charge has left the cell without the cell's ever having been fully selected, and this provides a leakage mode. Thus, the cell of the present invention is preferably constructed as a "charge-coupled" cell, i.e., the capacitance of the node between the two transistors is preferably minimized.

One main embodiment of the invention reduces this parasitic capacitance by using both frontside and backside gates to address a common polysilicon channel: the gates are offset, so that both must be turned on to connect the capacitor to the bit line, but they are also overlapping, so that charge pumping through the node between them is minimized.

Although the versions using a polysilicon-channel transistor are presently preferred, other embodiments of the present invention use a bulk (monocrystalline-channel) transistor. It should be noted that, in both transistor embodiments, a minimum-geometry patterned gate length can be used for both transistor gates, since there is no n+node between the transistors to provide outdiffusion. That is, the effective channel length of each of the two pass transistors is reduced by outdiffusion from only one side, so that the ratio of effective length to pattern length is higher than it would otherwise be. Moreover, this means that punchthrough is much less of a problem, even at very short patterned channel length.

Thus, the present invention provides a DRAM cell which provides greatly increased flexibility in design of DRAM arrays.

The present invention also provides DRAM arrays wherein column multiplexing is used to provide increased sense amplifier pitch.

The present invention further provides a cross-point DRAM cell array wherein sense amplifier pitch does not limit density.

To achieve these and other objects, the present invention provides: A dynamic random access memory cell comprising: a storage capacitor; first and second pass transistors connected in series to selectively connect said storage capacitor to a bitline.

The present invention also provides: A dynamic random access memory cell comprising: a storage capacitor; a pass transistor selectively connecting said storage capacitor to a bitline, said pass transistor having a channel region which is capacitatively coupled both to a frontside gate and to a backside gate, said frontside and backside gates each being conductive but not being connected together, said frontside and backside gates respectively being coupled to overlapping but laterally separate portions of said channel region.

The present invention also provides: A dynamic random access memory comprising: a plurality of memory cells arranged in rows and columns, ones of said memory cells comprising a storage capacitor and a first pass transistor comprising a gate connected to a wordline and a second pass transistor comprising a gate connected to a column select line, said first and second pass transistors being interposed in series between said storage capacitor and a bitline; and a plurality of sense amplifiers each connected to more than one pair of said bitlines and each comprising multiplexing transistors each controlled by one of said column select lines to selectively connect each said sense amplifier to no more than one of said pairs of bitlines.

The present invention also provides: A dynamic random access memory comprising: a plurality of memory cells arranged in rows and columns, ones of said memory cells comprising a storage capacitor; a pass transistor selectively connecting said storage capacitors to a bitline, said pass transistor having a channel region which is capacitatively coupled both to a front side gate and to a back side gate, said front side and back side gates each being conductive but not being connected together, said front side and back side gates respectively being coupled to overlapping but not completely coincident portions of said channel region, one of said two gates being connected to a wordline and the other of said two gates being connected to a column select line; and a plurality of sense amplifiers each connected to more than one pair of said bitlines and each comprising multiplexing transistors each controlled by one of said column select lines to selectively connect each said sense amplifier to no more than one of said pairs of bitlines.

According to the present invention there is also provided: A dynamic random access memory comprising: a plurality of memory cells arranged in rows and columns, ones of said memory cells comprising a storage capacitor and a first pass transistor comprising a gate connected to a segment select line and a second pass transistor comprising a gate connected to a wordline, said first and second pass transistors being interposed in series between said storage capacitor and a bitline; and a plurality of sense amplifiers, each connected to at least one pair of said bitlines.

BRIEF DESCRIPTION OF THE DRAWING

The present invention will be described with reference to the accompanying drawings, wherein:

FIG. 1 shows an equivalent circuit diagram of a one-transistor DRAM cell according to the prior art;

FIG. 2 shows an equivalent circuit diagram of a DRAM cell according to the present invention;

FIG. 3A shows a first embodiment of the present invention, using normal MOS transistors to address a bulk capacitor;

FIG. 3B shows a second embodiment of the invention, wherein a trench capacitor is addressed by a thin poly transistor, which is addressed by both a front side gate and an offset but partially overlapping back side gate;

FIG. 3C shows a further embodiment of the invention, wherein a trench capacitor is addressed by two thin polysilicon channel transistors in the trench, connected in series;

DESCRIPTION OF THE PREFERRED EMBODIMENTS

The present invention will be described in great detail, with reference to particular preferred embodiments. However, it will be recognized by those skilled in the art that the present invention provides a fundamental innovation in the art of dynamic random access memory cells, and its scope is therefore to be construed broadly. The present invention can be modified and varied in a tremendous variety of ways, and its scope is expressly not limited except as specified by the claims. The various embodiments discussed are merely illustrative and not limiting.

FIG. 1 shows an equivalent circuit configuration of a sample prior art DRAM cell. That is, a pass transistor 102 is accessed by a word line 104, to connect the charge stored in a capacitor 106 to a bitline 108. The capacitor 106 is shown as having one plate connected to ground, although in practice these capacitors will typically be connected to an adjacent bitline to which the pass transistor is not connected. The bitline 108 will be connected to a sense amplifier, not shown, which senses the output of the cell. By precharging the bitline to a value intermediate between the expected voltage levels to be found on the storage capacitor depending on the 1 or 0 information stored in the cell, and then using a conventional cross-coupled latch to compare the bitline to another similarly-precharged bitline, the charge stored in the storage capacitor can be quite sensitively detected.

For comparison, FIG. 2 shows an equivalent circuit diagram of a sample embodiment of the memory cell of the present invention. In this embodiment, a storage capacitor Cs is separated from bitline 120 by pass transistors Q1 and Q2 connected in series. Thus, both transistors must be turned on to connect the storage capacitor to the bitline in order to read out the information that is stored on the storage capacitor. Transistor Q2 is shown as connected to a word line 122, and transistor Q1 is shown as connected to a column decode or column select line 126, but the order in which these are connected is arbitrary, Note that a parasitic capacitance Cp is shown at the node intermediate between transistors Q1 and Q2. This parasitic capacitance should be minimized. Preferably a so-called "charge-coupled" structure is used, so that the channel of transistor Q1 immediately abuts the channel of transistor Q2, so that the amount of charge sharing (caused by charge which is stored on the node Cp after transistor Q2 has been turned on while transistor Q1 remains off) is at a minimum. Structures to accomplish this are well known in the art of selecting charge-coupled devices, and also in the art of MOS logic design generally.

Figure 4:
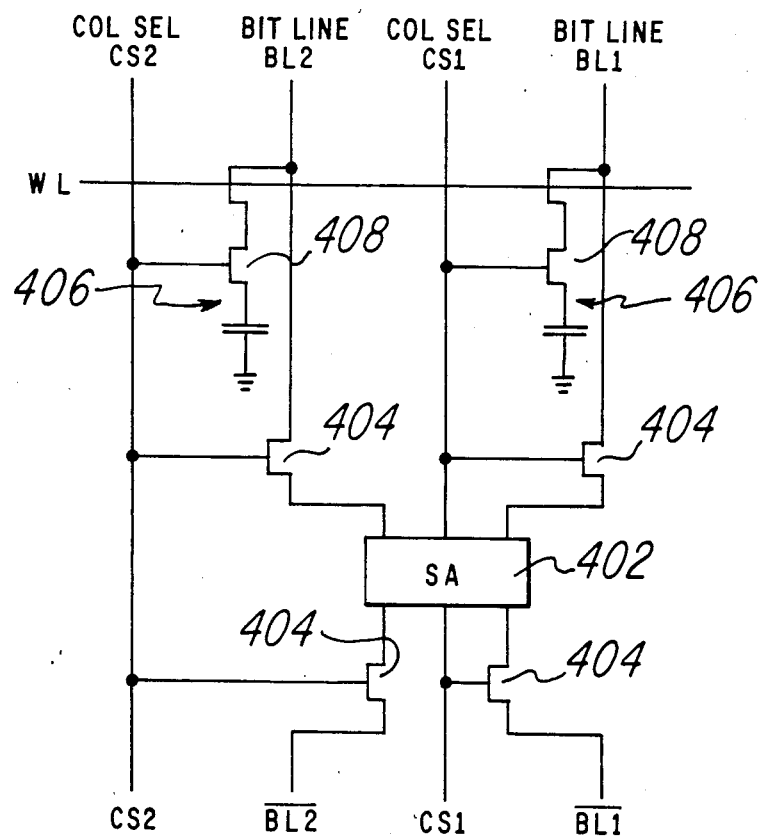
FIG. 4 shows an example of the class of embodiments of the invention where the extra select line in each cell is used for multiplexing two columns of cells onto a single sense amplifier.

The structure of FIG. 2 gives major advantages in cell selection, and relaxes the constraints on sense amplifier layout; but otherwise the operation of the sense and refresh operations is quite conventional. That is, the bitline is precharged to a value intermediate between the possible expected voltage levels to be found on the storage capacitor, and a conventional cross-coupled latch is used to compare the bitline to another similarly-precharged bitline, so that the charge stored in the storage capacitor can be detected. Similarly, the sense amplifier also refreshes the cell it has just sensed, in conventional fashion. The chip overhead circuitry is also very similar to that used in the prior art; refresh timing circuitry, I/O amplifiers, subarray select logic (if used), and other building blocks can all be essentially the same. One difference is the potential use of column select lines in some embodiments of the present invention; the column address decode, in addition to selecting the proper sense amplifier for readout, must also select the proper column select line, if a configuration such as that of FIG. 4 is used. However, this simply means that one or two of the least significant column address bits is used to select one of two (or one of four, etc.) column select lines, and this presents no major differences from prior art implementations.

FIG. 38 shows a presently preferred embodiment of the invention. In a P- substrate 202, a storage capacitor 204 and dielectric 206 define the storage capacitor. This capacitor is accessed by a thin polysilicon transistor 208. This transistor preferably has a channel thickness less than 2000 angstroms, and preferably has a channel doping which may range from intrinsic up to several times 10 to the 16th, or even to 10 to the 17th. This transistor 208 is interposed between the poly portions 220 which form a bitline and the poly portions 204 which forms one plate of the storage capacitor. The conduction through polysilicon channel region 208 is controlled both by a poly frontside gate 224 (which is preferably connected as a column select line) and a backside gate formed by the buried N+ word line 222. Note that the frontside and backside gates are overlapping (to minimize charge pumping through the parasitic capacitance of the node between them), but they are not completely overlapping, so that the transistor 208 is not turned on unless both frontside gate 224 and backside gate formed by wordline 222 are turned on. That is, the portion 208''' of channel region 208 is addressed by both gates, but channel region portion 208'' is addressed only by the front gate, and portion 208'' only by the back gate.

The buried N+ layer 222 preferably has a lower junction about 1.5 microns deep, and an upper junction about one half micron deep. It is preferable that the buried N+ layer not extend all the way to the surface, to avoid excessive capacitive coupling between this layer and the bitline. However, this feature is not strictly necessary to the invention.

A further sample embodiment is shown in FIG. 3C. In this embodiment, instead of having a thin poly transistor which is addressed both by front and back gates, two separate thin poly transistors 302 and 304 are connected in series to separate the storage capacitor 204 from the bitline 220. Storage capacitor 204 is preferably formed as a trench capacitor, and the polysilicon required for this storage capacitor is preferably formed in a single deposition step with the bitline 220 and the transistor channel regions 302 and 304. A first oxide isolated line (preferably oxide-isolated poly) forms wordline 306, and a separate oxide-isolated poly line forms column select line 308. Preferably the trench is refilled, e.g. with oxide, although this is not shown.

A third embodiment of the present invention is shown in FIG. 3A. This embodiment is less preferred than the embodiments of FIG. 3B and 3C, but also embodies some innovative concepts according to the present invention.

In this embodiment, transistors 504 and 506 are connected in series to connect bitline 520 to a bulk area below capacitor plate 502. A "high-C" implant is optionally used below the capacitor plate 502. Note that, by provision of these two transistors in series, the effects of outdiffusion are minimized, since no N+ region exists between the two transistors. Thus, the ratio of effective length to channel length for these two transistors is increased, and the problems of punchthrough are minimized.

Figure 3D:
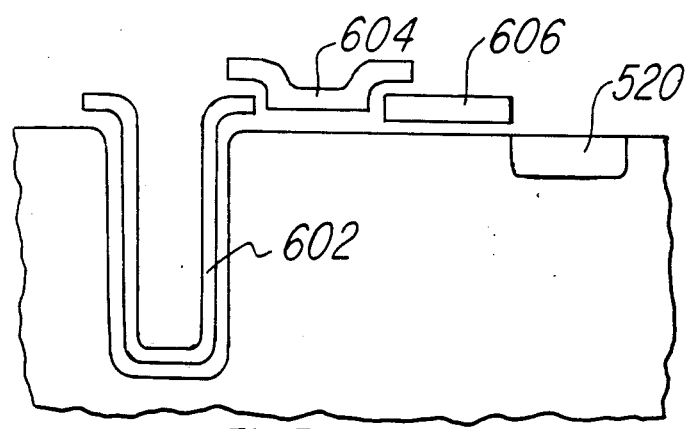
FIG. 3D shows a further embodiment of the invention, wherein a trench capacitor is addressed by two conventional MOS transistors in series.

A further embodiment of the present invention is shown in FIG. 3D. This embodiment is generally similar to the embodiment of FIG. 3A, except that a trench capacitor 602 is used in place of the bulk capacitor 502 of FIG. 3A. In this embodiment, transistors 604 and 606 are connected in series to connect bitline 520 to a bulk area below capacitor plate 602.

The fabrication of a sample embodiment of the present invention as shown generally in FIG. 3B is as follows.

First, a moat region is patterned, to define active device regions within a field oxide. Next, the buried N+ region is formed (e.g. by a high energy arsenic implant), optionally followed by a shallow compensating implant. This forms the buried N+ word line 222 shown in FIG. 3B.

Next, the trench is etched, and a thin high-quality oxide (e.g. 150 angstroms thick) is grown on the sides of the trench. This oxide will be the back gate oxide of the polysilicon pass transistor, and will also serve as the dielectric for the storage capacitor.

Next, a thick highly-doped polysilicon layer is conformally deposited, and etched back to (e.g.) 2 microns below the surface. This leaves remnants 204 of this thick poly layer only in the lower portions of the trenches, and nowhere else. Next, a thin poly layer is deposited, to provide the channel 208 and also the bitlines 220. This poly is preferably deposited to 1500 or 2000 angstroms thick, with a very light doping level, e.g. 10 to the 15th. This poly channel layer is preferably deposited directly on top of the thick poly, so that it makes ohmic contact to the thick poly layer. Next, a thin high quality dielectric is grown and/or deposited over this thin poly layer, to provide the topside gate oxide 232. Next, the second poly layer is deposited to a thickness of (e.g.) 0.5 microns at a high doping. This will provide the topside gate 224 of the polysilicon transistors, as well as providing one interconnect element in the array. Next, exposed portions of the thin first poly layer are ion implanted (or optionally silicided), to increase their conductivity. Thus, the channel region 208 of the polysilicon transistor remains at low conductivity, to achieve good turnoff characteristics, whereas the other portions of this layer are silicided and/or implanted to provide good interconnect characteristics.

At this point the fabrication of a cell is completed. Note, that the cell includes no contacts. This is a major advantage of this class of embodiments of the invention.

In configuring the array, the extra select line which now exists in each cell can be used for multiplexing two columns of cells onto a single sense amplifier. A sample of this class of embodiments of the invention is shown in FIG. 4, where column select lines CS1 and CS2 multiplex two pairs of columns of memory cells (lines BL1, BL2, BL1bar, and BL2bar) onto sense amplifier 402 through multiplexing transistors 404. (Each column has many memory cells 406 on it, but only two are shown, for clarity.) The desirability of multiplexing multiple columns of memory cells onto a single sense amplifier has become increasingly apparent as memory cells are scalled to ever smaller dimensions, since the sense amplifier pitch is becoming a limiting factor in array scaling. The desirability of multiplexing columns of cells onto a single sense amplifier has been widely recognized in the art, but has not previously been practical; the present invention makes this possible by its provision of a second pass transistor 408 in each cell 406. A particular advantage of the embodiment shown in FIG. 4 is that no additional area is consumed by the column select lines CS1 and CS2 in the preferred layout.

It should be noted that it is not strictly necessary that every single memory cell have two select lines according to the memory cell concepts of the present invention, although naturally this is greatly preferable.

As will be apparent to those skilled in the art, the present invention can be incorporated in a tremendous variety of modifications and variations, and is therefore expressly not limited except as specified in the accompanying claims.

What is claimed is:

1. A dynamic random access memory cell comprising:
   a trench storage capacitor;
   first and second pass transistors connected in series to selectively connect said storage capacitor to a bitline;
   said first and second pass transistors having a channel region which is capacitively coupled to their respective first and second pass transistor gates;
   said first and second pass transistor gates each being conductive but not being connected together;
   said first and second pass transistors having overlapping but laterally separate portions of said channel region.

2. A dynamic random access memory cell comprising:
   a storage capacitor;
   a pass transistor selectively connecting said storage capacitor to a bitline,
   said pass transistor having a channel region which is capacitatively coupled both to a frontside gate and to a backside gate,
   said frontside and backside gates each being conductive but not being connected together,
   said frontside and backside gates respectively being coupled to overlapping but laterally separate portions of said channel region.

3. The memory cell of claim 2, wherein said capacitor is a trench capacitor.

4. The memory cell of claim 1, wherein both said pass transistors comprise polysilicon channel regions.

5. The memory cell of claim 2, wherein said pass transistor comprises polysilicon channel regions.

6. The memory cell or claim 1 wherein said first pass transistor is a bulk monocrystalline insulated gate FET.

7. The memory cell of claim 1, wherein said second pass transistor is a bulk monocrystalline insulated gate FET.

8. The memory cell of claim 1, wherein both said first and second pass transistors are bulk monocrystalline insulated gate FETs.

9. The memory cell of claim 1, wherein at least one of said first and second pass transistors is a bulk monocrystalline insulated gate FET, and wherein said storage capacitor is a trench capacitor.

10. A dynamic random access memory comprising:
    a plurality of memory cells arranged in rows and columns, ones of said memory cells comprising
       a storage capacitor and
       a first pass transistor comprising a gate connected to a wordline and
       a second pass transistor comprising a gate connected to a column select line,
       said first and second pass transistors being interposed in series between said storage capacitor and a bitline; and
    a plurality of sense amplifiers,
       each connected to more than one pair of said bitlines
       and each comprising multiplexing transistors each controlled by one of said column select lines to selectively connect each said sense amplifier to no more than one of said pairs of bitlines.

11. A dynamic random access memory comprising:
    a plurality of memory cells arranged in rows and columns ones of said memory cells comprising
       a trench storage capacitor;
       a pass transistor selectively connecting said storage capacitors to a bitline, said pass transistor having a channel region which is capacitatively coupled both to a front side gate and to a back side gate, said front side and back side gates each being conductive but not being connected together, said front side and back side gates respectively being coupled to overlapping but not completely coincident portions of said channel region, one of said two gates being connected to a wordline and the other of said two gates being connected to a column select line; and a plurality of sense amplifiers, each connected to more than one pair of said bitlines and each comprising multiplexing transistors each controlled by one of said column select lines to selectively connect each said sense amplifier to no more than one of said pairs of bitlines.

12. The memory of claim 10, wherein said memory cells are arranged in a plurality of subarrays.

13. The memory of claim 11, wherein said memory cells are arranged in a plurality of subarrays.

14. The memory of claim 10, wherein said sense amplifier further comprises means for refreshing said cells.

15. A dynamic random access memory comprising:

a plurality of memory cells arranged in rows and columns, ones of said memory cells comprising a storage capacitor and a first pass transistor comprising a gate connected to a segment select line and a second pass transistor comprising a gate connected to a wordline, said first and second pass transistors being interposed in series between said storage capacitor and a bitline; and a plurality of sense amplifiers, each connected to at least one pair of said bitlines.

16. A dynamic random acess memory comprising:

a plurality of memory cells arranged in rows and columns, ones of said memory cells comprising a trench storage capacitor;

a pass transistor selectively connecting said storage capacitors to a bitline, said pass transistor having a channel region which is capacitatively coupled both to a front side gate and to a back side gate, said front side and back side gates each being conductive but not being connected together, said front side and back side gates respectively being coupled to overlapping but not completely coincident portions of said channel region, one of said two gates being connected to a wordline and the other of said two gates being connected to a segment select line; and a plurality of sense amplifiers, each connected to at least one pair of said bitlines.

17. A dynamic random access memory cell comprising:

a trench storage capacitor;

first and second pass transistors connected in series to selectively connect said storage capacitor to a bitline;

both first and second pass transistors have polysilicon channel regions, and;

at least one of said first and second pass transistors is located in the same trench as the trench storage capacitor.

* * * * *